United States Patent
Sato et al.

(10) Patent No.: US 9,500,961 B2
(45) Date of Patent: Nov. 22, 2016

(54) PATTERN FORMATION METHOD AND EXPOSURE APPARATUS

(71) Applicant: KABUSHIKI KAISHA TOSHIBA, Tokyo (JP)

(72) Inventors: Takashi Sato, Kanagawa (JP); Akiko Yamada, Tokyo (JP); Takeshi Suto, Kanagawa (JP)

(73) Assignee: Kabushiki Kaisha Toshiba, Tokyo (JP)

(*) Notice: Subject to any disclaimer, the term of this patent is extended or adjusted under 35 U.S.C. 154(b) by 0 days.

(21) Appl. No.: 14/741,554

(22) Filed: Jun. 17, 2015

(65) Prior Publication Data

US 2016/0238947 A1   Aug. 18, 2016

(30) Foreign Application Priority Data

Feb. 17, 2015   (JP) ................. 2015-029088

(51) Int. Cl.
| | | |
|---|---|---|
| *G03B 27/52* | (2006.01) | |
| *G03B 27/54* | (2006.01) | |
| *G03F 7/20* | (2006.01) | |

(52) U.S. Cl.
CPC ......... *G03F 7/70408* (2013.01); *G03F 7/7015* (2013.01); *G03F 7/70325* (2013.01); *G03F 7/70733* (2013.01)

(58) Field of Classification Search
CPC ............. G03F 7/7015; G03F 7/70733; G03F 7/70216; G03F 7/70283; G03F 7/70275; G03F 7/70325; G03F 7/70225–7/70241; G03F 7/70408; G03F 7/70375; G03F 7/70058; G03F 7/7035; G03F 7/70641; G03F 7/2002; G03F 7/2045; G03F 7/2047; G03F 7/2067

USPC ............... 355/52, 53, 55, 67–77; 250/492.1, 250/492.2, 492.22, 493.1, 548
See application file for complete search history.

(56) References Cited

U.S. PATENT DOCUMENTS 4,947,413 A * 8/1990 Jewell ................. G03F 7/70091
                                                              250/492.2
6,373,553 B1 * 4/2002 Singh .................. G03F 7/70408
                                                              355/53

(Continued)

FOREIGN PATENT DOCUMENTS

| JP | 10-111409 | 4/1998 |
| JP | 4724183 | 7/2011 |

(Continued)

OTHER PUBLICATIONS

Sato, T., "Focus position and depth of two-dimensional patterning by Talbot effect lithography", *Microelectonic Engineering*, vol. 123, Jul. 1, 2014, pp. 80-83.

(Continued)

*Primary Examiner* — Christina Riddle
(74) *Attorney, Agent, or Firm* — Finnegan, Henderson, Farabow, Garrett & Dunner LLP

(57) ABSTRACT

According to one embodiment, According to one embodiment, a pattern formation method includes disposing a mask and a substrate separately from each other, the mask having a plurality of light transmitting portions arranged periodically. The method includes irradiating the mask with illumination light emitted from an optical part to irradiate the substrate with at least a part of the illumination light transmitted through the light transmitting portions. a distance d between the mask and the substrate, a wavelength λ of the illumination light, a pitch p of an arrangement of the light transmitting parts, a numerical aperture NAi of the optical part, and at least one natural number n satisfy the following. $p \geq 2\lambda$, $(np^2/\lambda) - \alpha \leq d \leq (np^2/\lambda) + \alpha$, $\alpha = p^2/(2\lambda)$ and $\lambda/(8np) \leq NAi < \lambda/(2np)$.

20 Claims, 10 Drawing Sheets

(56) References Cited

U.S. PATENT DOCUMENTS

| | | |
|---|---|---|
| 8,368,871 B2 | 2/2013 | Solak et al. |
| 8,524,443 B2 | 9/2013 | Clube et al. |
| 8,525,973 B2 | 9/2013 | Solak et al. |
| 8,617,775 B2 | 12/2013 | Solak |
| 8,904,316 B2 | 12/2014 | Solak et al. |
| 9,007,566 B2 | 4/2015 | Clube et al. |
| 9,036,133 B2 | 5/2015 | Solak et al. |
| 2005/0057735 A1* | 3/2005 | Smith ............... G03F 7/70233 355/55 |
| 2006/0192933 A1* | 8/2006 | Kim ............... G03F 7/70125 355/67 |
| 2015/0055113 A1 | 2/2015 | Sato et al. |

FOREIGN PATENT DOCUMENTS

| | | |
|---|---|---|
| JP | 2013-011757 | 1/2013 |
| JP | 2013-016696 | 1/2013 |
| JP | 2013-051292 | 3/2013 |
| JP | 2013-161919 | 8/2013 |

OTHER PUBLICATIONS

Sato, T., "Talbot effect immersion lithography by self-imaging of very fine grating patterns", *Journal of Vacuum Science & Technology B: Microelectronics and Nanometer Structures*, 30(6), Nov./Dec. 2012, 06FG02, pp. 1-5.

Ursanski, L. et al., "Defect tolerant extreme ultraviolet lithography technique", *Journal of Vacuum Science & Technology B: Microelectronics and Nanometer Structures*, 30(6), Nov./Dec. 2012, 06F502-1, pp. 1-5.

\* cited by examiner

PATTERN FORMATION METHOD AND EXPOSURE APPARATUS

CROSS-REFERENCE TO RELATED APPLICATIONS

This application is based upon and claims the benefit of priority from Japanese Patent Application No.2015-029088, filed on Feb. 17, 2015; the entire contents of which are incorporated herein by reference.

FIELD

Embodiments described herein relate generally to a pattern formation method and an exposure apparatus.

BACKGROUND

For example, when a mask having a repetitive pattern is irradiated with light, a phenomenon called Talbot interference (Talbot effect) occurs. In Talbot interference, an image of a pattern is periodically generated along a traveling direction of light. It is possible to form a fine pattern by exposing a transfer target substrate using the image generated by the Talbot interference. In such a pattern formation method as described above, it is desired to improve the accuracy of the pattern to be formed.

DETAILED DESCRIPTION

According to one embodiment, a pattern formation method includes disposing a mask and a substrate separately from each other, the mask having a plurality of light transmitting portions arranged periodically. The method includes irradiating the mask with illumination light emitted from an optical part to irradiate the substrate with at least a part of the illumination light transmitted through the light transmitting portions. A distance d between the mask and the substrate, a wavelength λ of the illumination light, a pitch p of an arrangement of the light transmitting parts, a numerical aperture NAi of the optical part, and at least one natural number n satisfy the following.

$p \geq 2\lambda,$ $(np^2/\lambda) - \alpha \leq d \leq (np^2/\lambda) + \alpha,$ $\alpha = p^2/(2\lambda),$ and $\lambda/(8np) \leq NAi < \lambda/(2np)$ According to one embodiment, an exposure apparatus includes a mask holding part, a stage and an optical part. The mask holding part holds a mask, the mask having a plurality of light transmitting portions arranged periodically. A substrate is mounted on the stage. The optical part emits illumination light. The mask is irradiated with the illumination light. The substrate is irradiated with at least a part of the illumination light transmitted through the light transmitting portions. A distance d between the mask and the substrate, a wavelength λ of the illumination light, a pitch p of an arrangement of the plurality of light transmitting portions, a numerical aperture NAi of the optical part, and at least one natural number n satisfy the following.

$p \geq 2\lambda,$ $(np^2/\lambda) - \alpha \leq d \leq (np^2/\lambda) + \alpha,$ $\alpha = p^2/(2\lambda),$ and $\lambda/(8np) \leq NAi < \lambda/(2np)$ Each of the embodiments will hereinafter be explained with reference to the accompanying drawings.

It should be noted that the drawings are schematic or conceptual ones, and the relationship between the thickness and the width of each constituent, the dimensional ratio between the constituents, and so on are not necessarily the same as real ones. Further, even in the case of expressing the same constituents, the dimensions and the ratio between the constituents are differently expressed by drawing in some cases.

It should be noted that in the specification and the drawings of the patent application, substantially the same constituents as those having already been described with respect to drawings having already been mentioned will be denoted with the same reference symbols, and the detailed explanation thereof will arbitrarily be omitted.

Figure 1:
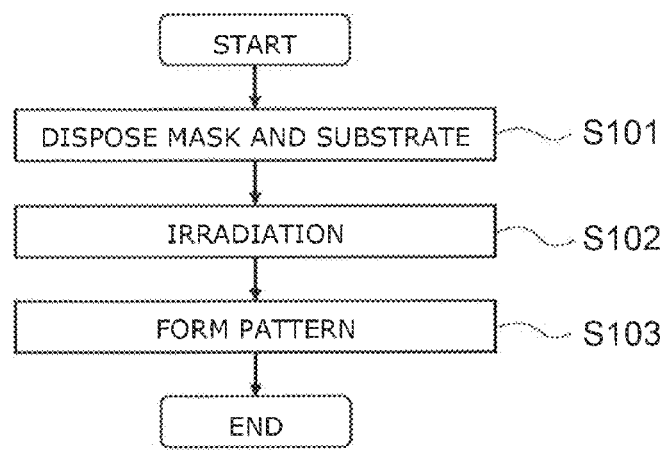
FIG. 1 is a flowchart illustrating an example of a pattern formation method according to the embodiment.

FIG. 1 is a flowchart illustrating an example of a pattern formation method according to the embodiment.

The pattern formation method according to the embodiment includes the steps S101 through S103.

As shown in FIG. 1, in the step S101, a mask M1 and a substrate W1 (a transfer target substrate) are disposed. In the step S102, the substrate W1 is irradiated with the light having been transmitted through the mask M1. Then, in the step S103, a pattern is formed on the substrate W1 in accordance with the areas irradiated with the light. The pattern formation method according to the embodiment relates to such a photolithography process as described above.

Firstly, an exposure apparatus, a mask, a substrate, and so on used for the pattern formation method according to the embodiment will be explained.

Figure 2:
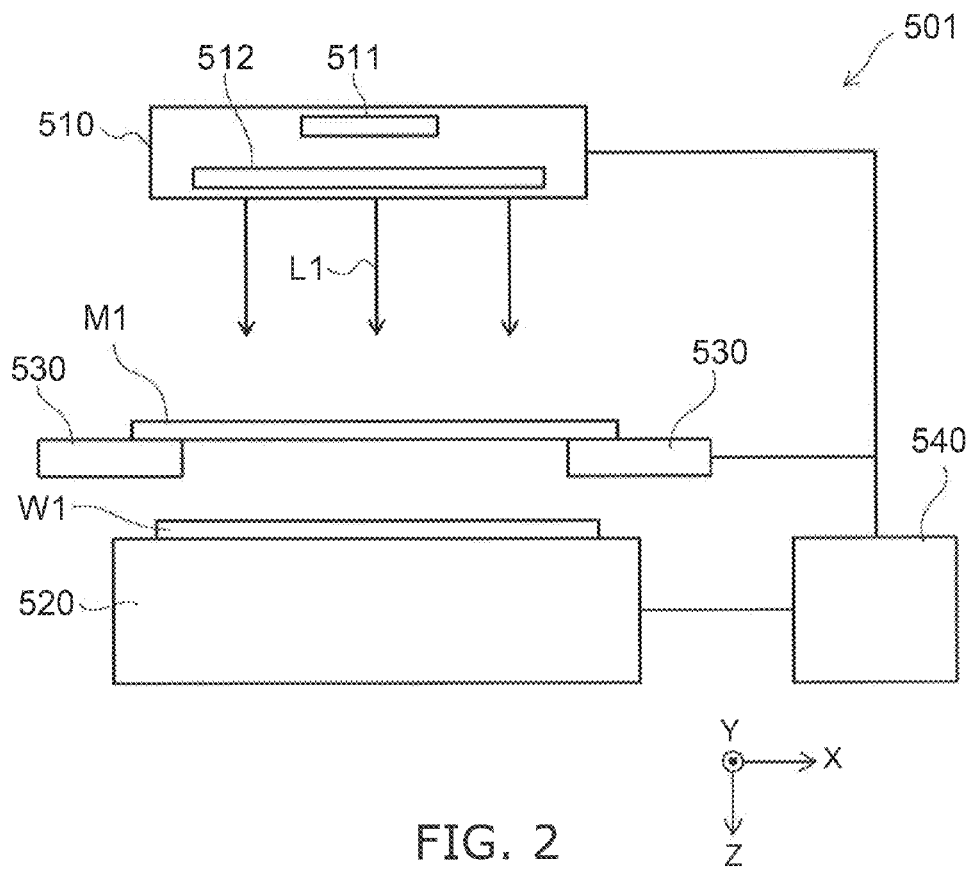
FIG. 2 is a schematic view illustrating an example of the exposure apparatus according to the embodiment.

FIG. 2 is a schematic view illustrating an example of the exposure apparatus according to the embodiment.

As shown in FIG. 2, the exposure apparatus 501 includes an illumination optical system 510 (an optical part), a stage 520, a mask holding part 530, and a control section 540. The exposure apparatus 501 is, for example, a proximity exposure apparatus.

Here, in the state in which the mask M1 and the substrate W1 are arranged in such a manner as shown in FIG. 2, the direction from the mask M1 toward the substrate W1 is defined as the Z-axis direction. One of the directions perpendicular to the Z-axis direction is defined as the X-axis direction. The direction, which is perpendicular to the Z-axis direction, and is perpendicular to the X-axis direction, is defined as the Y-axis direction.

The stage 520 is a stage on which the substrate W1 is mounted. The stage 520 suctions to hold the substrate W1 on the stage 520 using, for example, vacuum suction.

The mask holding part 530 holds the mask M1. Thus, the mask M1 and the substrate W1 are separately disposed from each other.

It should be noted that the stage 520 can move in the Z-axis direction, and along the X-Y plane. Further, the mask holding part 530 can move in the Z-axis direction, and along the X-Y plane. Thus, the relative positional relationship between the substrate W1 and the mask M1 can be adjusted.

Figure 3:
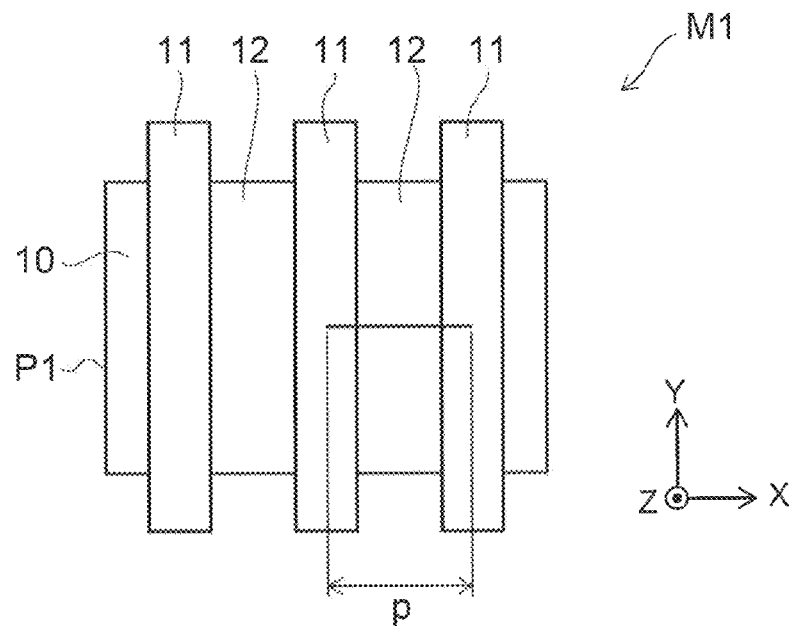
FIG. 3 is a schematic plan view illustrating an example of the mask according to the embodiment.

FIG. 3 is a schematic plan view illustrating an example of the mask according to the embodiment.

FIG. 3 shows the mask M1 when viewed along the Z-axis direction. The mask M1 has a member (a mask substrate 10) for transmitting light with a predetermined wavelength, and a plurality of light blocking portions 11. It should be noted that although FIG. 3 shows the three light blocking portions 11 alone, the number of the light blocking portions 11 is equal to or larger than three in the embodiment.

As the mask substrate 10, there is used, for example, quartz or synthetic quartz. As the light blocking portions 11, there is used, for example, chromium (Cr). The light blocking portions 11 are each a part for blocking the light with which the mask M1 is irradiated in the lithography process.

The mask substrate 10 has a principal surface (surface P1) disposed in parallel to the X-Y plane. The light blocking portions 11 each have a constant width, and are arranged at regular intervals on the surface P1. In other words, the plurality of light blocking portions 11 is arranged with a periodic pattern.

The light blocking portions 11 each extend along the Y-axis direction, and are separated from each other in the X-axis direction. The pitch p of the periodic pattern corresponds to a distance between the center of one of the light blocking portions 11 along the X-axis direction and the center of adjacent one of the light blocking portions 11. The pitch p is, for example, not less than 200 nm and not more than 2000 nm. In this example, the pitch p is 920 nm.

Due to the mask substrate 10 having a light transmissive property and a plurality of light blocking portions 11, a plurality of light transmitting portions 12 is provided to the mask M1. The light transmitting portions 12 correspond to parts of the mask substrate 10 where the light is not blocked by the light blocking portions 11. In accordance with the arrangement of the plurality of light blocking portions 11, the plurality of light transmitting portions 12 also has a periodic pattern with the pitch p on the surface P1.

It should be noted that although in the example shown in FIG. 3, the plurality of light blocking portions 11 and the plurality of light transmitting portions 12 each form a line-and-space periodic pattern, the periodic pattern can also be an island-shaped pattern.

The illumination optical system 510 includes a light source 511 and an optical member 512. The light source 511 is, for example, either one of an ArF excimer laser and a KrF excimer laser. The wavelength of the illumination light emitted from the light source 511 is, for example, not less than 190 nm and not more than 250 nm. As the light source 511, it is also possible to use a high-pressure mercury lamp or other laser sources.

The optical member 512 includes at least either one of a lens, a mirror, an aperture, a polarization element, an optical diffuser plate, and an optical filter. For example, as the optical member 512, there can be used at least either one of a fly-eye lens, an optical diffuser plate, and a vibrating mirror.

The fly-eye lens is an optical member having a plurality of lenses arranged in a plane.

The optical diffuser plate is an optical member for diffusing the incident light in a plurality of directions. Specifically, a part of the incident light having entered the optical diffuser plate travels in a first direction, and another part of the incident light travels in a second direction different from the first direction.

The vibrating mirror is a reflecting member capable of switching the direction in which the incident light is reflected. Specifically, the vibrating mirror has a first state of reflecting the incident light toward the first direction and a second state of reflecting the incident light toward the second direction different from the first direction. By using the optical member such as a fly-eye lens, an optical diffuser plate, or a vibrating mirror, it is possible to, for example, convert the light source from a point light source into a surface light source, and at the same time suppress the luminance variation of the light source. For example, the numerical aperture of the illumination optical system can be adjusted.

The illumination optical system 510 irradiates the mask M1 with the illumination light L1, which has been emitted from the light source, via these optical members.

In the embodiment, the distance d between the mask M1 and the substrate W1, the wavelength λ of the illumination light L1, and the pitch p of the mask M1 satisfy Formula 1, Formula 2, and Formula 3 below.

Formula 1

$$p \geq \lambda \tag{1}$$

Formula 2

$$\frac{np^2}{\lambda} - \alpha \leq d \leq \frac{np^2}{\lambda} + \alpha \tag{2}$$

Formula 3

$$\alpha = \frac{p^2}{2\lambda} \tag{3}$$

Here, n is a natural number having a certain value.

Figure 4:
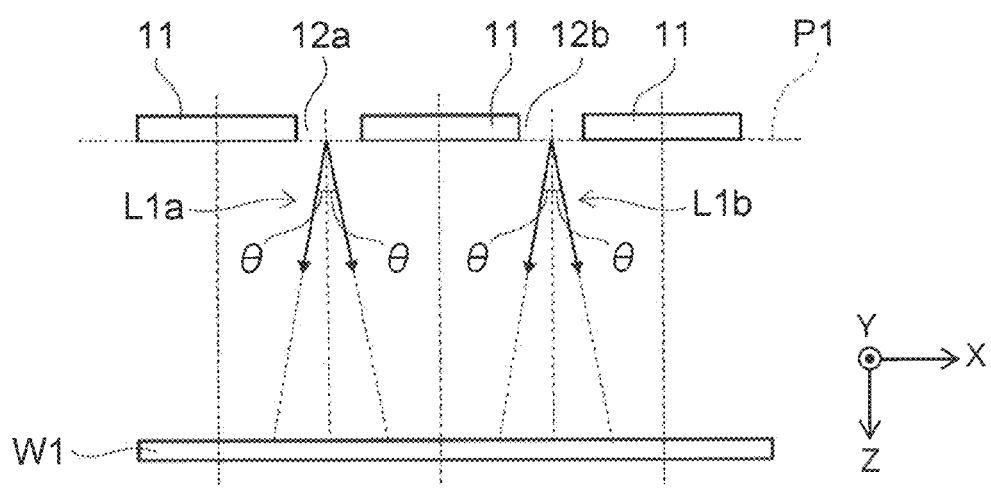
FIG. 4 is a schematic view illustrating an example of a light path from the mask irradiated according to the embodiment.

FIG. 4 is a schematic view illustrating an example of a light path from the mask irradiated according to the embodiment. FIG. 4 shows an example of the light paths of the illumination light L1 entering the mask M1 after the illumination light L1 passes through the light transmitting portions 12 of the mask M1.

For example, the plurality of light transmitting portions 12 includes a first light transmitting portion 12a and a second light transmitting portion 12b. The first light transmitting portion 12a and the second light transmitting portion 12b are the light transmitting portions 12 adjacent to each other. A first light beam L1a out of the illumination light L1 is an incident light beam to the first light transmitting portion 12a. A second light beam L1b out of the illumination light L1 is an incident light beam to the second light transmitting portion 12b.

As shown in FIG. 4, the first light beam L1a includes a plurality of light rays. For example, the first light beam Lia includes a light ray traveling in parallel to the Z-axis direction, and a plurality of light rays traveling in respective directions oblique to the Z-axis direction. The maximum angle between the traveling directions of the plurality of light rays included in the first light beam L1a and the Z-axis direction is defined as an angle θ (θ>0). In other words, the angle θ is the maximum incident angle of the light entering the surface P1.

Similarly, the second light beam L1b also includes a plurality of light rays. The maximum angle between the traveling directions of the plurality of light rays included in the second light beam L1b and the Z-axis direction is the angle θ (θ>0).

The angle θ corresponds to the numerical aperture NAi of the illumination optical system 510. The numerical aperture NAi of the illumination optical system 510 is expressed as follows.

Formula 4

$$NAi = \sin \theta \tag{4}$$

As described above, in the embodiment, the illumination light L1 entering the mask M1 is not parallel light traveling in parallel to the Z-axis direction, but has a spread of the angle θ.

Further, in the embodiment, the numerical aperture NAi of the illumination optical system 510, the wavelength λ of the illumination light L1, and the pitch p of the mask M1 satisfy Formula 5 below.

Formula 5

$$\frac{\lambda}{8np} \leq NAi < \frac{\lambda}{2np} \tag{5}$$

Here, n is a natural number. The value of n is not particularly limited, but, for example, is not less than 1 and not more than 1000.

The substrate W1 includes a base body and a photosensitive material (resist) disposed on the surface of the base body. The base body is, for example, a semiconductor layer or a thin film, and the resist is disposed on the semiconductor layer or the thin film. In other words, the resist is disposed between the base body and the mask M1. The principal surface of the substrate W1 is disposed in parallel to the X-Y plane.

The control section 540 controls actions of the illumination optical system 510, the stage 520, the mask holding part 530, and so on.

Then, an operation of the embodiment will be explained.

A part of the illumination light L1 emitted from the illumination optical system 510 enters the plurality of light transmitting portions 12, and is then transmitted therethrough. Thus, interference light is generated due to the Talbot effect (Talbot interference) described later. The substrate W1 is irradiated with the interference light (at least a part of the light having been transmitted through the light transmitting portion 12) generated in such a manner.

When the substrate W1 is irradiated with the interference light generated by being transmitted through the light transmitting portions 12, the resist changes in accordance with the area irradiated with the light. Subsequently, the substrate W1 is dipped in a developing solution to remove a part of the resist. Thus, the pattern corresponding to the periodic pattern of the mask M1 is formed on the substrate W1. It should be noted that it is also possible to etch the base body below the resist using the resist provided with the pattern.

Here, the Talbot interference (Talbot effect) will be explained.

Figure 5:
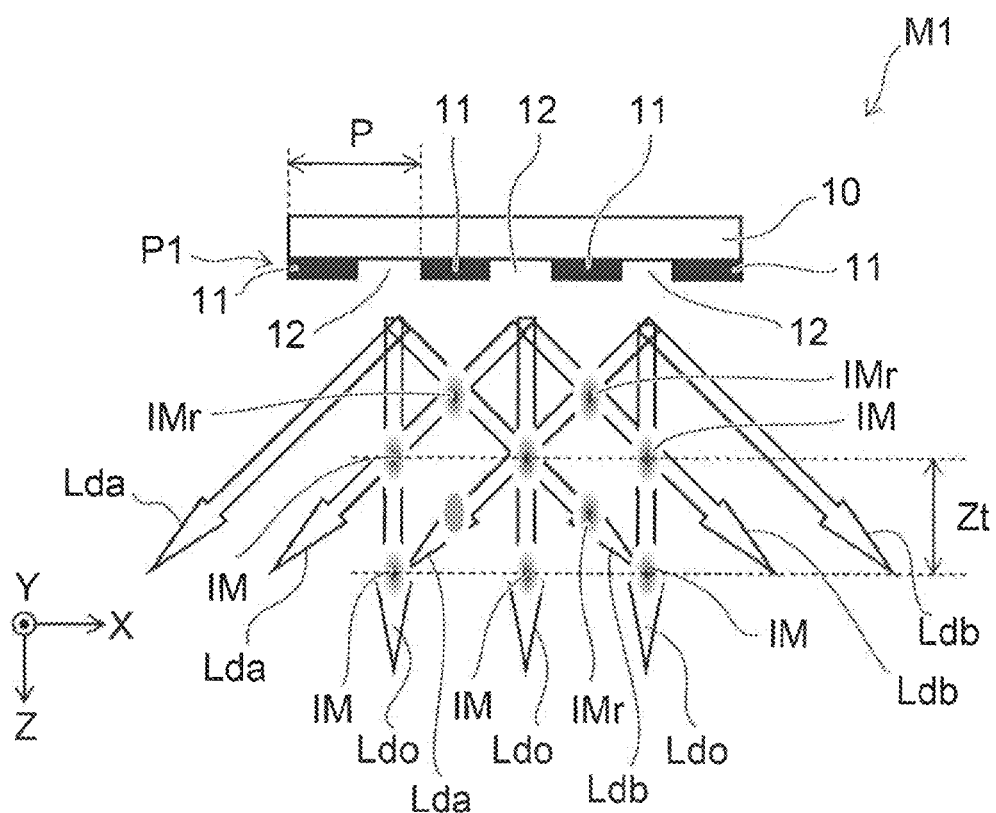
FIG. 5 is a schematic view illustrating an example of the Talbot interference.

FIG. 5 is a schematic view illustrating an example of the Talbot interference. As described above, in the embodiment, the angle θ satisfies θ>0. It should be noted that for the sake of explanation of the Talbot interference, firstly, there is shown the case in which the parallel light with the angle θ satisfying θ=0 has entered the mask M1.

The Talbot interference is a phenomenon that when irradiating the repetitive pattern (the light blocking portions 11 and the light transmitting portions 12) of the mask M1 with coherent light good in coherency, reversed images IMr and self-imaging images IM of the repetitive pattern of the mask M1 appear periodically in the traveling direction of the light.

As shown in FIG. 5, the Talbot interference occurs under the condition in which at least 0-order light Ld0, $+1^{st}$ order light Lda, and $-1^{st}$ order light Ldb are generated from the light transmitting portion 12. FIG. 5 shows only the 0-order light and the $\pm 1^{st}$ light. Further, at the position where the diffracted light beams are in the same phase, the self-imaging image IM is generated. Here, the self-imaging image IM denotes the formation of the image in which a light intensity distribution corresponding to the positions of the light transmitting portions 12 appears. The reversed image IMr denotes the formation of the image in which a light intensity distribution corresponding to a pattern obtained by reversing the periodic pattern of the light transmitting portions 12 appears.

The plurality of self-imaging images IM is arranged side by side in the X-axis direction so as to correspond to the periodic pattern of the light transmitting portions 12. The position of the reversed image IMr is an intermediate position between the self-imaging images IM adjacent to each other in the X-axis direction.

The reversed images IMr and the self-imaging images IM appear alternately and periodically along the Z-axis direction. The length of a pitch along the Z-axis direction, at which the self-imaging images appear, is called a Talbot distance. The pitch (pattern pitch) of the periodic pattern of the light transmitting portions 12 is represented by p, and the wavelength of the light with which the mask M1 is irradiated is represented by λ. In the case in which the pitch p is approximate to the wavelength λ, the Talbot distance Zt is expressed as follows.

Formula 6

$$z_t = \frac{p^2}{\lambda}\left(1 + \sqrt{1 - \left(\frac{\lambda}{p}\right)^2}\right) \tag{6}$$

In the case in which the pitch p is more than twice of the wavelength λ, the Talbot distance Zt is approximately expressed as follows.

Formula 7

$$z_t = \frac{2p^2}{\lambda}, \quad p \gg \lambda \tag{7}$$

The plurality of self-imaging images IM is arranged side by side in the Z-axis direction at an interval of such a Talbot distance Zt as described above. The positions, which are located along the Z-axis direction, and at which the reversed images IMr are generated, are each an intermediate position between the self-imaging images adjacent to each other in the Z-axis direction.

Figure 6:
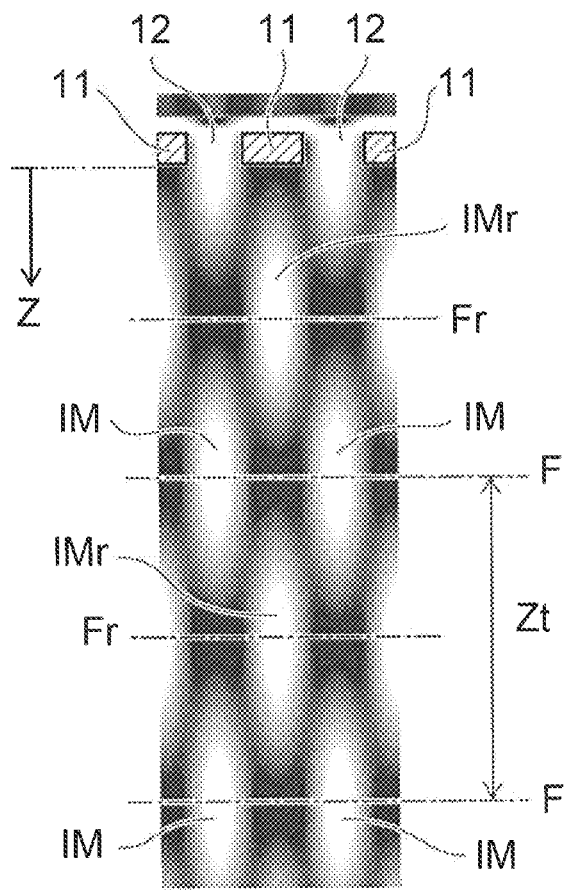
FIG. 6 is a schematic view illustrating an example of a simulation result of the light intensity distribution due to the Talbot interference.

FIG. 6 is a schematic view illustrating an example of a simulation result of the light intensity distribution due to the Talbot interference.

FIG. 6 shows the light intensity distribution using a grayscale. The grayscale shows that the whiter the color is, the higher the light intensity is.

In this simulation, there is assumed the illumination light emitted from a point light source disposed at an infinite distance from the mask. In other words, the illumination light entering the mask is parallel light parallel to the Z-axis direction. Further, FIG. 6 shows the light intensity distribution taking only the 1$^{st}$ order diffracted light into consideration.

As shown in FIG. 6, for example, the reversed images IMr and the self-imaging images IM appear alternately in the Z-axis direction with reference to the lower end position of the light blocking portion 11. Here, a plane including the center of the reversed image IMr and parallel to the X-Y plane is defined as a reversed image plane Fr. A plane including the center of the self-imaging image IM and parallel to the X-Y plane is defined as a self-imaging image plane F. In the reversed image plane Fr or the self-imaging image plane F, pattern transfer can be performed.

In the lithography process in manufacturing a semiconductor device, in the case in which the high resolution is required, deep ultraviolet (DUV) light obtained using the ArF excimer laser with a wavelength of 193 nm as the light source is used as the illumination light source for the mask in some cases.

For example, there is a method according to a reference example using a quadruple-sized mask (reticle) of the pattern to be actually formed and an exposure apparatus including a reduced projection optical system in order to form a fine pattern.

However, in recent years, it is becoming difficult to form the mask pattern even by using the quadruple-sized mask due to miniaturization of the pattern. Further, due to the physical limitation of the design and the member of the optical system, the size of the pattern, which can be formed on the wafer, approaches the limit.

As the resolution enhancement techniques (RET) for dealing with such a circumstance, there has been proposed an exposure method according to the reference example such as double patterning. The double patterning is not easy, as there are a lot of problems to be solved such as a displacement caused when overlapping the first exposure and the second exposure with each other.

The pattern size L of the resolution limit pattern is expressed as follows representing the light source wavelength by λ, and the numerical aperture of the projection optical system by NA.

Formula 8

$$L = k_1 \frac{\lambda}{NA} \tag{8}$$

Here, the following is true.
Formula 9

$$NA = n \sin \theta_1 \tag{9}$$

The character n represents the refractive index between the lens and a transfer substrate, and the symbol θ1 represents an angle formed by an image point on the optical axis with respect to the radius of the exit pupil. The symbol $k_1$ is called a process factor. The $k_1$ value, with which the resolving power defining the cutoff frequency of the spatial frequency is obtained, is 0.5 in the case of the normal incidence, or 0.25 in the case of the oblique-incidence illumination.

In the optical design, the empirical upper limit value of sin θ1 is, for example, about 0.95. Therefore, by increasing the value of n, high resolving power can be obtained. However, it is difficult to set the refractive index of the medium between the optical lens and the substrate to be higher than the refractive index of optical glass used as the lens due to optical design limitations. For example, as the optical glass for ArF, there is used quartz. The refractive index of the quartz with respect to the light having the wavelength of 193 nm is 1.56. Therefore, the medium having the refractive power lower than 1.56 is inserted. For example, as the medium, water having the refractive index of 1.44 is used. From the relationship therebetween, the maximum value of NA of a liquid immersion exposure apparatus is, for example, 1.35.

In the case of using the ArF excimer laser as the light source, if $k_1$=0.25 and NA=1.35 are assumed in Formula 8, the resolvable minimum dimension is 37.5 nm. Further, in such pattern transfer, a minute error and unevenness of the optical system exerts a significant influence on the transfer accuracy. Therefore, in some cases, the cost for selecting the optical material, and the cost for keeping the high perfection level as the optical system become huge.

Meanwhile, the resolvable pattern size is proportional to the wavelength of the light emitted from the light source. Therefore, it is also considered to further shorten the wavelength. There has been considered a projection exposure apparatus using the light (extreme ultraviolet (EUV) light) having the wavelength of 13.5 nm.

In the case of using the EUV light, for example, NA=0.25 is adopted. The optical system satisfying NA=0.32 is also planned. Assuming that NA=0.32, k1=0.25 are satisfied, the resolvable minimum dimension in the case of using the EUV light becomes 10.5 nm. However, it is technically difficult to use the EUV light source, and it is difficult to provide a light source from which an output sufficient for semiconductor manufacturing can be obtained.

In the lithography using the EUV light, when transferring the semiconductor pattern, a reflective mask is used. Therefore, the illumination light is made to obliquely enter the mask. Therefore, in order to keep the pattern accuracy, the pattern layout is devised.

In contrast, according to the proximity method using the Talbot effect as in the exposure method according to the embodiment, it is possible to transfer the pattern equivalent to or finer than the case of using the projection optical system without using the expensive projection optical system.

By using the proximity exposure method making use of the Talbot interference, the resolution in pattern transfer can be improved. For example, in the semiconductor lithography, the resolution can be improved.

The pattern formation method with the proximity method using the Talbot interference has a feature that even if a defect exists in the original plate (the mask), the defect is less likely to be transferred. It is conceivable that this point is an advantage in the semiconductor manufacturing process.

As described above, in the proximity exposure method using the Talbot interference, the pattern high in resolution and small in the number of defects can be formed using a simple exposure method without using the projection optical system.

Figure 7:
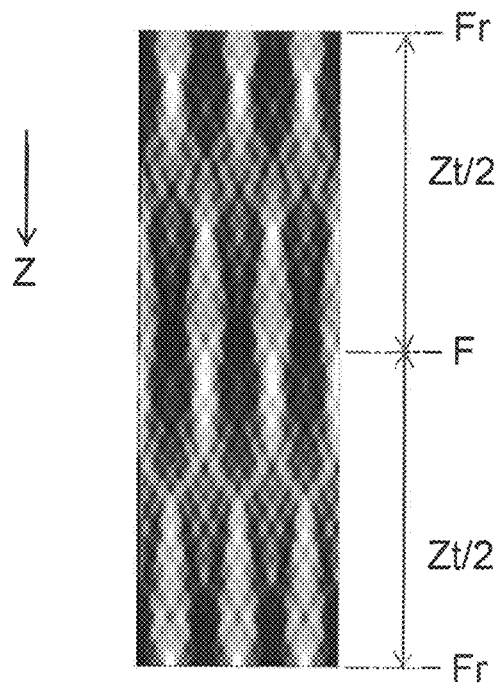
FIG. 7 is a schematic view illustrating an example of a simulation result of the light intensity distribution due to the Talbot interference.

FIG. 7 is a schematic view illustrating an example of a simulation result of the light intensity distribution due to the Talbot interference. In FIG. 7, the light intensity distribution is also shown using a grayscale. The light intensity distribution shown in FIG. 7 is the light intensity distribution taking the high-order diffracted light into consideration. Further, as the illumination light entering the mask, the parallel light parallel to the Z-axis direction is assumed similarly to the case shown in FIG. 6.

In the case in which the pitch p is more than twice of the wavelength, namely p≥2λ is satisfied, the diffracted light other than the $1^{st}$ order diffracted light occurs. On this occasion, a fine interference pattern compared to FIG. 6 occurs as shown in FIG. 7. For example, at the position slightly displaced in the Z-axis direction from the self-imaging image plane F, the self-imaging image IM (or the reversed image IMr) is split.

Based on the explanation of the Talbot interference described above, the light intensity distribution in the embodiment will hereinafter be explained.

As described above, in the embodiment, the numerical aperture NA of the illumination optical system 510 satisfies NA>0. In other words, the lithography process is performed using the illumination light having the spread with the angle θ.

Figure 8:
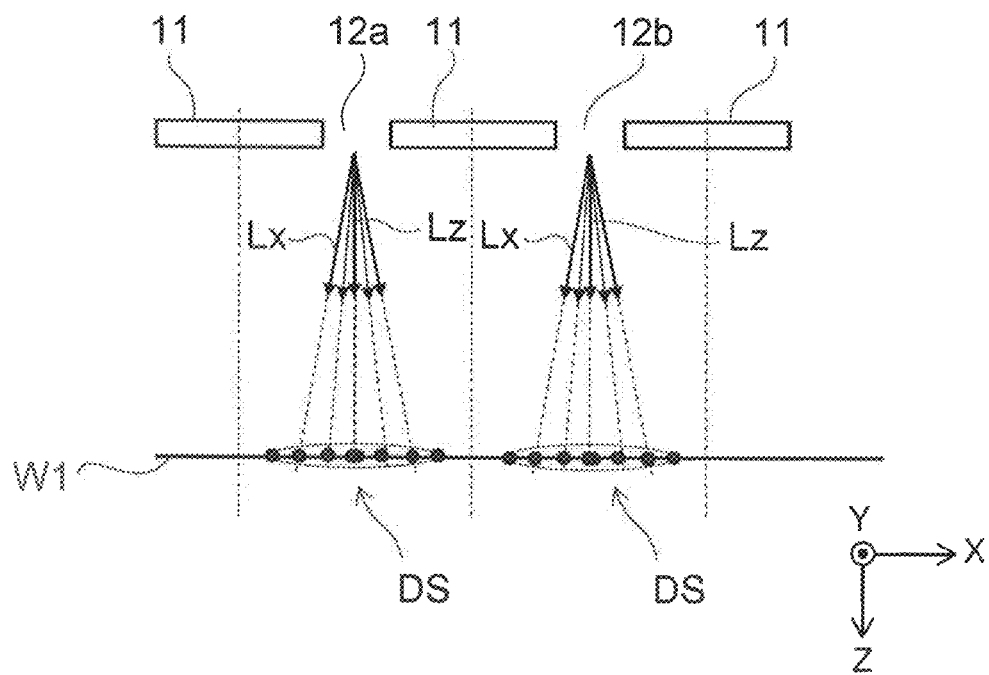
FIG. 8 is a schematic view illustrating an example of the light intensity distribution according to the embodiment.

FIG. 8 is a schematic view illustrating an example of the light intensity distribution according to the embodiment.

As described above, the distance d between the mask M1 and the substrate W1 satisfies Formula 2. For example, the distance d is the distance slightly shifted from the Talbot distance Zt, and satisfies the following.

Formula 10

$$Z_r - \alpha \leq d \leq Z_r + \alpha \quad (10)$$

It should be noted that FIG. 8 shows only a part of the light intensity distribution and a part of the illumination light L1 for the sake of the explanation.

As shown in FIG. 8, the illumination light L1 includes light rays Lz. The light rays Lz are light rays traveling in a direction parallel to the Z-axis direction, and then entering the plurality of light transmitting portions 12. On this occasion, due to the Talbot interference of the high-order diffracted light of the light rays Lz, there is generated the light intensity distribution with the self-imaging image IM split at the position of the substrate W1.

For example, the illumination light L1 further includes light rays Lx. The light rays Lx are light rays traveling in a direction tilted as much as an angle θ with respect to the Z-axis direction, and then entering the plurality of light transmitting portions 12. On this occasion, due to the Talbot interference of the high-order diffracted light of the light rays Lx, there is generated the light intensity distribution with the self-imaging image IM split at the position of the substrate W1.

The illumination light L1 according to the embodiment includes a plurality of light rays including the light rays Lz and the light rays Lx. In other words, the illumination light L1 includes a plurality of light rays each having an angle between the Z-axis direction and the traveling direction equal to or smaller than θ. On this occasion, in reality, the distribution DS obtained by superimposing the plurality of split light intensity distributions on each other as shown in FIG. 8. Thus, the fine interference pattern generated by the high-order diffracted light is blurred.

Incidentally, as explained with reference to FIG. 7, in the Talbot interference irradiated with the parallel light, the split of the self-imaging image IM occurs. The pattern generated at the position slightly separated from the self-imaging image plane is different from the pattern generated on the self-imaging image plane. When performing the lithography, in the case in which the substrate is slightly displaced from the self-imaging image plane, the dimensional error of the pattern to be resolved is apt to increase, Further, the pattern to be resolved is apt to have an unintended shape.

In contrast, in the embodiment, Formulas 1 through 5 are satisfied. On this occasion, the light entering the mask M1 is not the parallel light, but has the spread with the angle θ. Thus, the light intensity distribution generated on the substrate W1 becomes the light intensity distribution obtained by superimposing the fine patterns due to the high-order diffracted light on each other as explained with reference to FIG. 8. As a result, the fine patterns due to the high-order diffracted light are blurred as a whole. Specifically, in the light intensity distribution obtained by the superimposition, the fine interference pattern due to the high-order diffracted light can be inhibited from occurring. Thus, even in the case in which the positions of the substrate and the mask are shifted from each other, the pattern to be formed is less affected by the fine interference pattern due to the high-order diffracted light. Therefore, the dimensional error can be made smaller, and the focal depth can be increased. According to the embodiment, a highly accurate pattern can be formed.

Hereinafter the consideration leading to finding out of the condition described above will be explained.

The self-imaging image due to the Talbot effect has the spread in the Z-axis direction centered on the position distant from the mask M1 as much as the Talbot distance Zt. The spread corresponds to the focal depth. When representing the focal depth by DOF, DOF=±Zt/4 is obtained due to the calculation with the Rayleigh criterion (Takashi Sato, Focus position and depth of two-dimensional patterning by Talbot effect lithography, Microelectronic Engineering, Volume 123, 1 Jul. 2014, Pages 80-83, ISSN 0167-9317). Therefore, the distance d between the substrate W1 and the mask M1 is set to satisfy the condition of Zt−Zt/4≤d≤Zt+Zt/4. The Formulas 3 and 10 are derived from the above condition and Formula 7.

Figure 9:
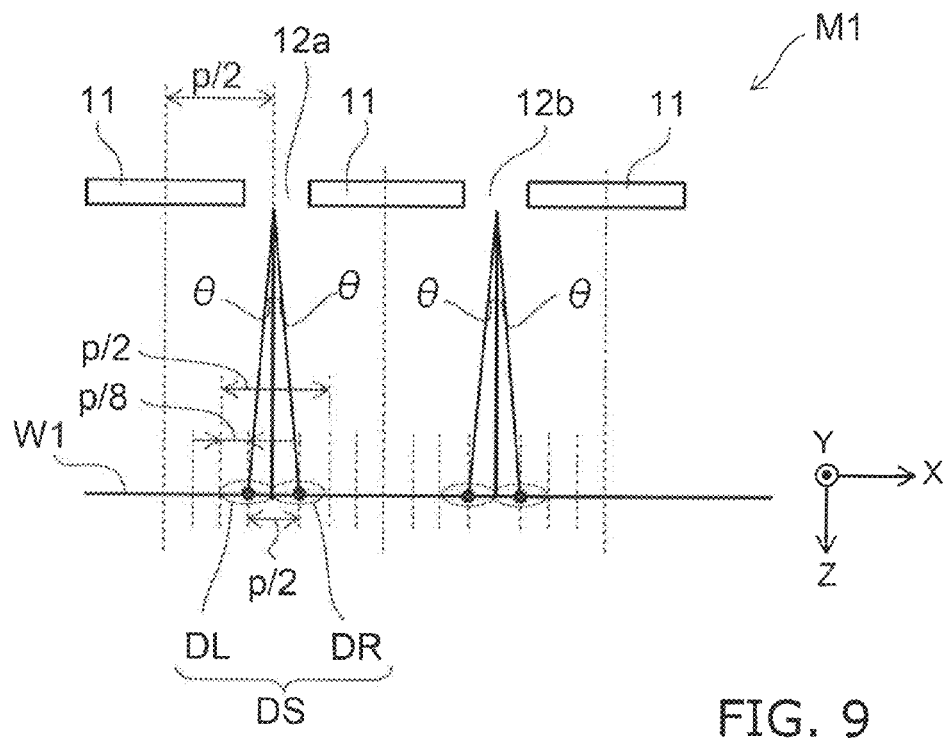
FIG. 9 is a schematic view illustrating an example of the light intensity distribution according to the embodiment.

FIG. 9 is a schematic view illustrating an example of the light intensity distribution according to the embodiment.

As shown in FIG. 9, the light intensity distribution (distribution DS) corresponding to one of the light transmitting portions 12 can be thought to be the superimposition between, for example, the distribution DL and the distribution DR. Here, the case in which the self-imaging image IM is split into two is considered. The distribution DL is the superimposition of one (e.g., the left side) of the distributions obtained by splitting the self-imaging image IM. The distribution DR is the superimposition of the other (e.g., the right side) of the distributions obtained by splitting the self-imaging image IM. It should be noted that although in this example, the case in which the self imaging image IM is split into two is considered, the embodiment includes the cases of a variety of interference patterns.

Here, when the angle θ increases, the width (e.g., the length along the X-axis direction) of the entire light intensity distribution (distribution DS) is broadened. Similarly, when the angle θ increases, the width of the distribution DL and the width of the distribution DR are broadened.

If the angle θ is too large, the contrast between the light intensity distribution corresponding to the first light transmitting portion 12a and the light intensity distribution corresponding to the second light transmitting portion 12b is lowered, and the resolution is lowered. Therefore, there is assumed the case in which the light intensity distribution is split within a range of p/2. On this occasion, the distance between the center of the distribution DL and the center of the distribution DR is maximized when the light intensity distribution is split into two at regular intervals, and becomes, for example, p/4 due to the symmetric property of the pattern.

In the present embodiment, the distribution DL and the distribution DR overlap each other. In other words, the patterns separated into two are combined with each other due to the spread of the illumination light source. Thus, it is possible to blur the pattern of the light intensity distribution generated by the split. The condition is as follows.

Formula 11

$$\frac{p}{8} \le Z_t \sin\theta \tag{11}$$

The following is derived from Formulas 11 and 7.

Formula 12

$$\sin\theta \ge \frac{\lambda}{16p} \tag{12}$$

Figure 10:
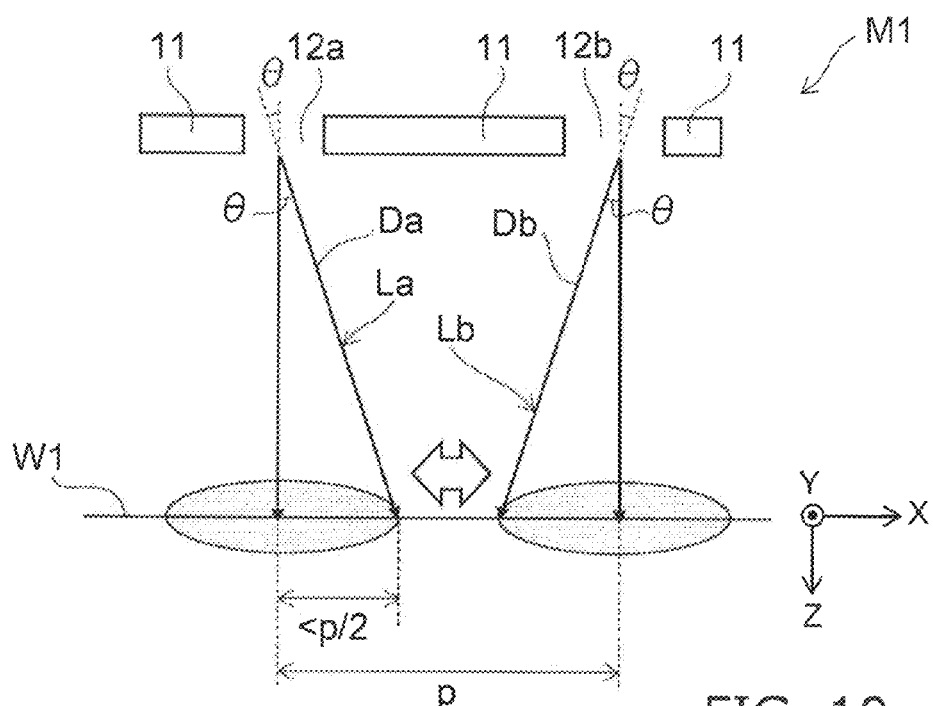
FIG. 10 is a schematic view illustrating an example of the light intensity distribution according to the embodiment.

FIG. 10 is a schematic view illustrating an example of the light intensity distribution according to the embodiment.

As shown in FIG. 10, the illumination light L1 includes, for example, a light ray La and a light ray Lb.

The light ray La enters the first light transmitting portion 12a, and then travels in a direction Da tilted as much as the angle θ (+θ°) with respect to the Z-axis direction. The light ray Lb enters the second light transmitting portion 12b, and then travels in a direction Db tilted as much as the angle θ (−θ°) with respect to the Z-axis direction.

In the case in which the light ray La intersects with the light ray Lb between the substrate W1 and the mask M1, the light intensity distribution corresponding to the first light transmitting portion 12a and the light intensity distribution corresponding to the second light transmitting portion 12b overlap each other. On this occasion, it is unable to form the periodic pattern of the mask M1 on the substrate W1. Therefore, the illumination light source (the spread of the illumination light) is required to be smaller than such a condition. In the embodiment, the angle θ is determined so that the light ray La does not intersect with the light ray Lb between the substrate W1 and the mask M1.

The condition is as follows.

Formula 13

$$\frac{p}{2} > Z_t \sin\theta \tag{13}$$

The following is derived from Formulas 13 and 7.

Formula 14

$$\sin\theta < \frac{\lambda}{4p} \tag{14}$$

The following is derived from Formulas 12 and 14.

Formula 15

$$\frac{\lambda}{16p} \le \sin\theta < \frac{\lambda}{4p} \tag{15}$$

In the derivation of Formula 15 described above, the initial position at which the self-imaging image IM is generated due to the light having been transmitted through the mask M1 is considered, It should be noted that in the embodiment, it is also possible to perform the pattern transfer in the vicinity of the self-imaging image IM generated for the $n_1^{th}$ time from the mask M1. In this case the following is obtained ($n_1$ is a natural number).

Formula 16

$$\frac{\lambda}{16n_1 p} \le \sin\theta < \frac{\lambda}{4n_1 p} \tag{16}$$

Further, since the value of α in Formula 3 does not depend on the value of $n_1$, Formula 10 is modified as follows.

Formula 17

$$n_1 Z_r - \alpha \le d \le n_1 Z_r + \alpha \tag{17}$$

Further, in the embodiment, it is also possible to perform the pattern transfer in the vicinity of the reversed image plane Fr of the Talbot interference. In this case the following is obtained in substantially the same manner as the derivation of Formula 16 ($n_2$ is a natural number).

Formula 18

$$\frac{\lambda}{8(2n_2 - 1)p} \le \sin\theta < \frac{\lambda}{2(2n_2 - 1)p} \tag{18}$$

Formula 19

$$\left(\frac{2n_2 - 1}{2}\right) Z_t - \alpha \le d \le \left(\frac{2n_2 - 1}{2}\right) Z_t + \alpha \tag{19}$$

By organizing Formulas 16 and 18, Formula 5 is obtained. By organizing Formulas 17 and 19, Formula 2 is obtained.

Setting an odd number to n in Formula 5 corresponds to performing the pattern transfer in the vicinity of the reversed image plane Fr. Setting an even number to n corresponds to performing the pattern transfer in the vicinity of the self-imaging image plane F. By selecting the value of n, it is possible to perform the pattern transfer at the positions displaced as much as p/2 from each other.

Further, in Formula 2, the following can be assumed.

Formula 20

$$d \neq \frac{np^2}{\lambda} \quad (20)$$

It is also possible to perform the exposure a plurality of times at a plurality of values of the distance d including the range of Formula 20. On this occasion, the change of the value of the distance d and the exposure can also be performed continuously, Thus, it becomes easy for the fine pattern due to the high-order diffracted light to overlap each other at, for example, the position of the substrate W1. Therefore, the dimensional variation of the pattern is easily suppressed. Further, even in the case in which the distance d between the substrate W1 and the mask M1 varies due to the thickness of the resist, the dimensional variation of the pattern is suppressed.

Figure 11:
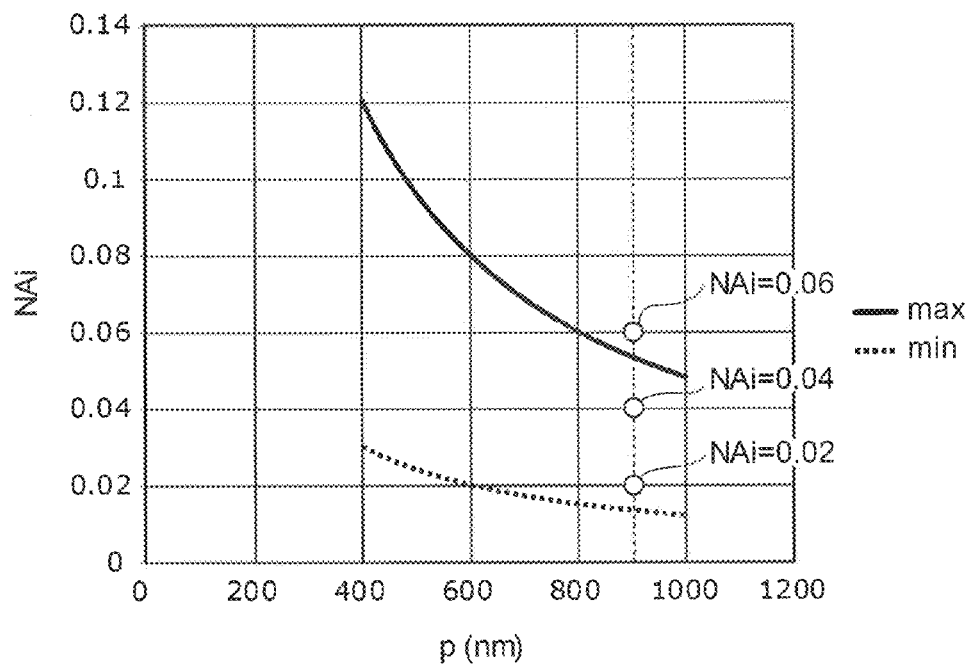
FIG. 11 is a graph illustrating an example of a relationship between the numerical aperture of the illumination optical system, and the pitch of the mask pattern.

FIG. 11 is a graph illustrating an example of a relationship between the numerical aperture of the illumination optical system, and the pitch of the mask pattern.

The vertical axis of FIG. 11 represents the numerical aperture NAi of the illumination optical system 510. The horizontal axis of FIG. 11 represents the pitch p of the periodical pattern provided to the mask M1.

FIG. 11 shows the upper limit UL of the numerical aperture NAi expressed by Formula 15, and the lower limit LL of the numerical aperture NAi expressed by Formula 15. Here, the light source wavelength is 193 nm.

As shown in FIG. 11, when the pitch p is 920 nm, the values of the numerical aperture NAi=0.04 and NAi=0.02 are included in the range of Formula 15. In contrast, when the pitch p is 920 nm, the value of the numerical aperture NAi=0.06 is not included in the range of Formula 15.

Figure 12A:
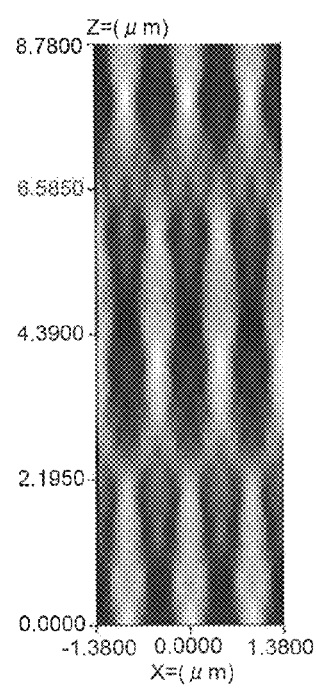
FIG. 12A to FIG. 12C are schematic diagrams illustrating an example of an optical simulation result of the Talbot interference.
Figure 12B:
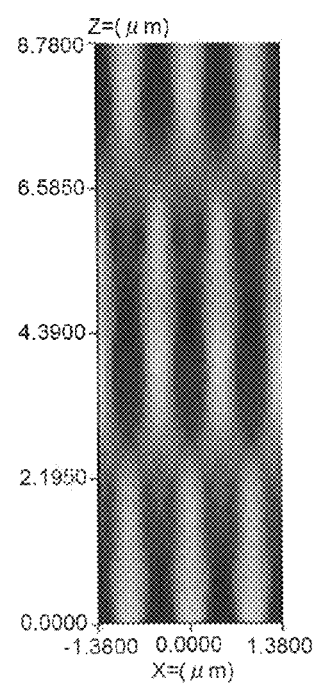
Figure 12C:
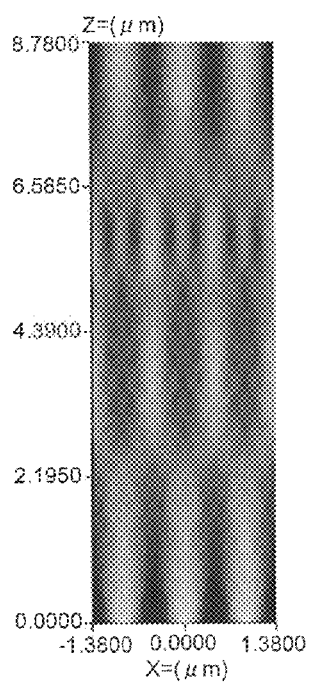

FIG. 12A to FIG. 12C are schematic diagrams illustrating an example of an optical simulation result of the Talbot interference, In the simulation, the values of the pitch p of the mask pattern and the wavelength $\lambda$ of the light source are assumed as p=920 nm and $\lambda$=193 nm.

FIG. 12A shows the simulation result in the case of the numerical aperture NAi=0.02. FIG. 12C shows the simulation result in the case of the numerical aperture NAi=0.04. FIG. 12C shows the simulation result in the case of the numerical aperture NAi=0.06.

It is understood that in the cases of NAi=0.02 and NAi=0.04 included in the range of Formula 15, the fine interference pattern due to the high-order diffracted light is blurred, and further, the contrast is also high. In contrast, it is understood that in the case of NAi=0.06, which is higher than the upper limit UL of the numerical aperture, the contrast is very low, and the pattern transfer is difficult.

Figure 13:
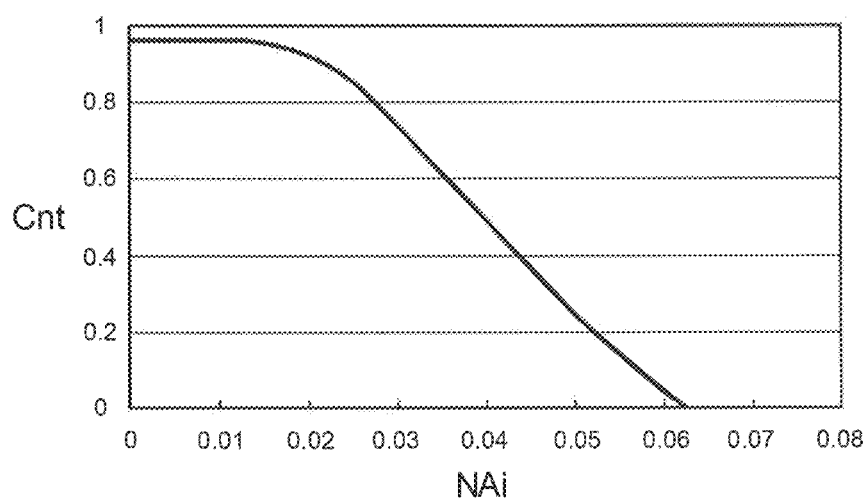
FIG. 13 is a graph illustrating an example of a relationship between the numerical aperture of the illumination optical system, and the contrast of the light intensity distribution.

FIG. 13 is a graph illustrating an example of a relationship between the numerical aperture of the illumination optical system, and the contrast of the light intensity distribution.

Here, similar to FIGS. 11, and 12A through 12C, the values of the pitch p and the wavelength $\lambda$ are assumed as p=920 nm and $\lambda$=193 nm.

The vertical axis of FIG. 13 represents the contrast Cnt of the light intensity distribution. The contrast Cnt is a ratio between the maximum value of the light intensity at the position distant as much as the Talbot distance Zt from the mask, and the minimum value of the light intensity at the position distant as much as the Talbot distance Zt from the mask. The horizontal axis of FIG. 13 represents the numerical aperture NAi. As is understood from FIG. 13, as the numerical aperture NAi increases, the contrast Cnt is lowered. In other words, it is understood that the transfer of the mask pattern becomes difficult.

When actually performing the simulation of the lithography in the condition in which the numerical aperture NAi is higher than the upper limit UL, it was understood that the mask pattern failed to be transferred to the resist.

Figure 14A:
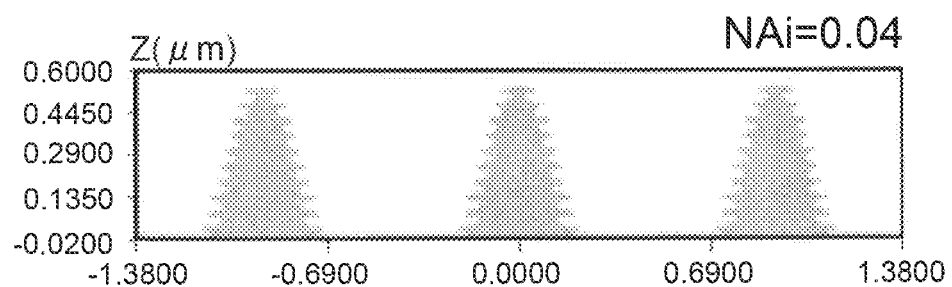
FIG. 14A to FIG. 14C are schematic views illustrating an example of a simulation result of a resist shape.
Figure 14B:
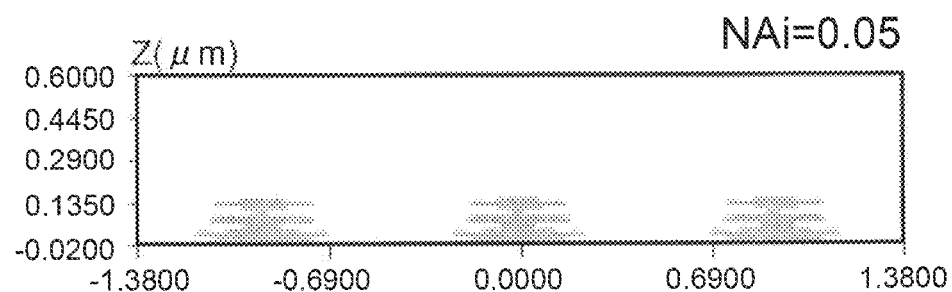
Figure 14C:
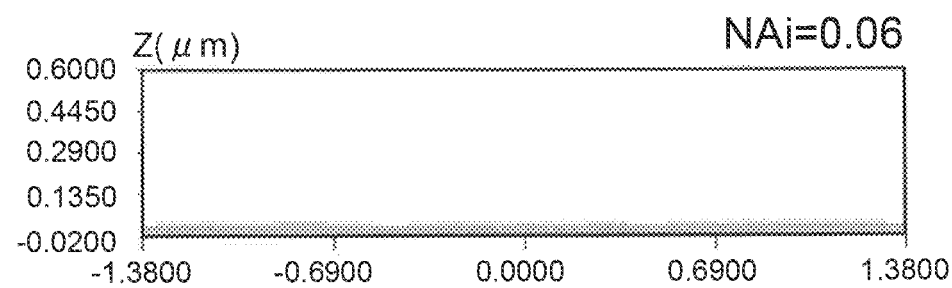

FIG. 14A to FIG. 14C are schematic views illustrating an example of a simulation result of a resist shape.

FIG. 14A to FIG. 14C each show the resist shape in the case of performing the lithography using the mask with the pitch p=920 nm, and the light source with the wavelength $\lambda$=193 nm.

In FIG. 14A, the numerical aperture of NAi is set to NAi=0.04. In FIG. 14B, the numerical aperture NAi=0.05 is set. It is understood that in the case in which the numerical aperture NAi is lower than the upper limit UL, the mask pattern is transferred to the resist as shown in FIGS. 14A and 14B.

In contrast, in FIG. 14C, the numerical aperture of NAi is set to NAi=0.06. It is understood that in the case in which the numerical aperture NAi is higher than the upper limit UL, the mask pattern fails to be transferred to the resist as shown in FIG. 14C. The simulation result shown in FIGS. 14A through 14C shows the fact that the upper limit UL of the numerical aperture NAi is proper.

Figure 15A:
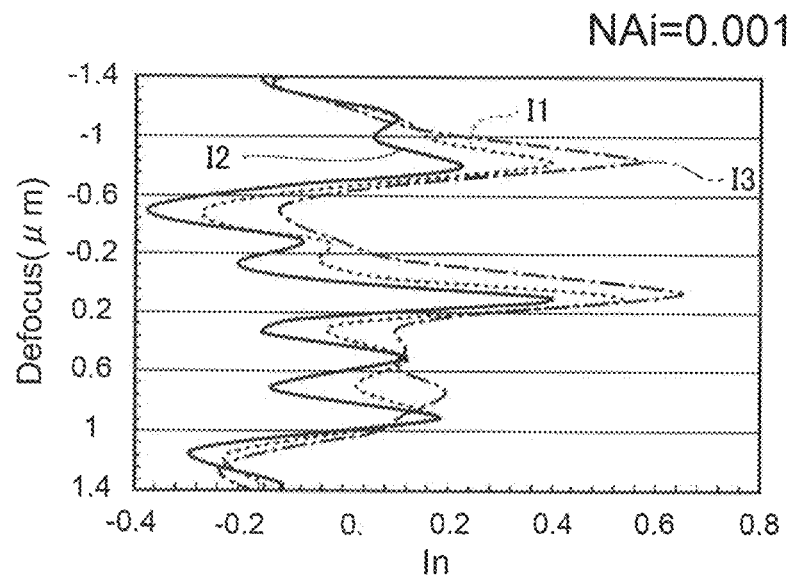
FIG. 15A and FIG. 15B are graphs illustrating an example of a simulation result of the lithography.
Figure 15B:
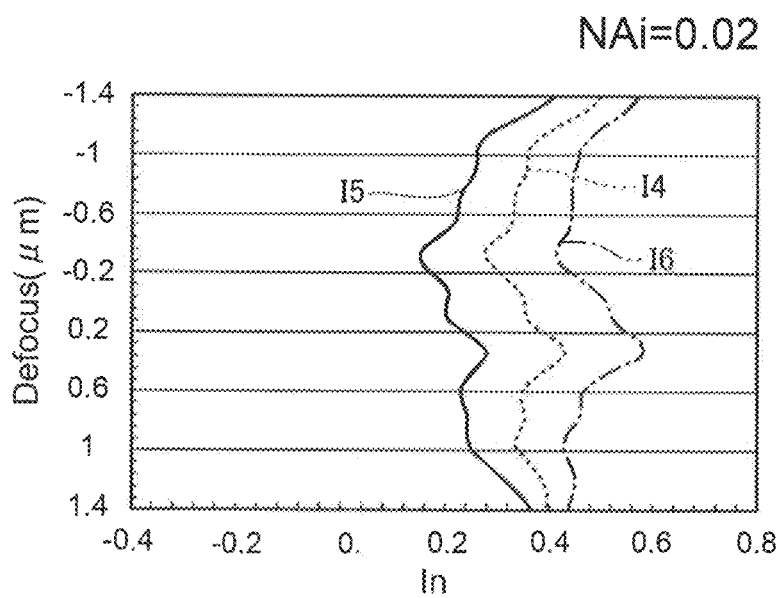

FIG. 15A and FIG. 15B are graphs illustrating an example of a simulation result of the lithography, The vertical axis of each of FIGS. 15A and 15B represents a focus position (Defocus) [μm]. Specifically, the vertical axis of each of FIGS. 15A and 15B represents a difference between the distance between the mask M1 and the substrate W1, and the Talbot distance it. The horizontal axis of each of FIGS. 15A and 15B represents a logarithmic value of the light intensity In. It should be noted that in the simulation, the values of the pitch p and the wavelength $\lambda$ are assumed as p=920 nm and $\lambda$=193 nm.

In FIG. 15A, the numerical aperture NAi of the illumination optical system is set to NAi=0.001. This corresponds to the case in which the point light source is disposed at an infinite distance from the mask. The light intensity I1 in FIG. 15A represents the light intensity at the moment when the dimensions of the pattern to be transferred to the resist become the desired dimensions. The light intensity I2 in FIG. 15A represents the light intensity at the moment when the dimensions of the pattern to be transferred to the resist become 10% larger than the desired dimensions. The light intensity I3 in FIG. 15A represents the light intensity at the moment when the dimensions of the pattern to be transferred to the resist become 10% smaller than the desired dimensions.

FIG. 15A shows the fact that the roughly desired dimensions can be obtained at the light intensity between the light intensity I2 and the light intensity I3.

In FIG. 15B, the numerical aperture NAi of the illumination optical system is set to NAi=0.02. The light intensity I4 in FIG. 15B represents the light intensity at the moment when the dimensions of the pattern to be transferred to the resist become the desired dimensions. The light intensity I5 in FIG. 15B represents the light intensity at the moment when the dimensions of the pattern to be transferred to the resist become 10% larger than the desired dimensions. The light intensity I6 in FIG. 15B represents the light intensity at the moment when the dimensions of the pattern to be transferred to the resist become 10% smaller than the desired dimensions.

FIG. 15B shows the fact that the roughly desired dimensions can be obtained at the light intensity between the light intensity I5 and the light intensity I6.

In the case in which the light intensity, at which the desired dimensions can be obtained, varies dramatically when the focus position is shifted, the dimensional error is apt to increase. It is desirable that the variation of the light intensity, at which the desired dimensions can be obtained, is smaller with respect to the variation of the focus position.

As shown in FIG. 15A, in the case in which the numerical aperture NAi is small, the light intensity varies dramatically in accordance with the focus position. This is because the coherency of the light is high.

In contrast, in the case of FIG. 15B, the coherency of the light is low, and therefore, even if the focus position is displaced, the variation in light intensity is small. It is understood that in the case in which the numerical aperture NAi is higher than the lower limit LL, even if the focus position is displaced, the dimensional error of the pattern to be transferred is small. The simulation result shown in FIGS. 15A and 15B shows the fact that the lower limit LL of the numerical aperture NAi is proper.

As explained hereinabove, in the embodiment, Formulas 1 through 5 are satisfied. On this occasion, the illumination light L1 having the spread with the angle θ enters the mask M1, and the Talbot effect due to the high-order diffracted light occurs. Further, since the numerical aperture NAi (angle θ) is lower than the upper limit of Formula 5, the contrast of the light intensity distribution is maintained. Since the numerical aperture NAi is higher than the lower limit of Formula 5, generation of the fine pattern of the light intensity distribution due to the high-order diffracted light is suppressed. Thus, the dimensional error of the light intensity distribution due to the high-order diffracted light can be reduced. Therefore, the accuracy of the pattern formed using the lithography can be improved.

For example, it is possible to adopt a method of adjusting the spectral bandwidth of the illumination light with which the mask is irradiated in the proximity exposure using the Talbot interference. Since the illumination light has the spectral bandwidth, the superimposition of the light intensity distributions corresponding respectively to the plurality of wavelengths is obtained, and thus, generation of the fine pattern of the light intensity distribution is suppressed. However, in the case in which the wavelength of the illumination light is short such as the case of using the ArF excimer laser, it is difficult to adjust the spectral bandwidth in some cases. In contrast, in the embodiment, by controlling the numerical aperture NAi of the illumination optical system 510, generation of the fine pattern of the light intensity distribution can be suppressed. Therefore, even in the case in which the wavelength of the illumination light is short, the accuracy of the pattern to be formed can be improved.

According to the embodiment, there are provided a pattern formation method and an exposure apparatus capable to forming a highly accurate pattern.

In the specification of the application, "perpendicular" and "parallel" refer to not only strictly perpendicular and strictly parallel but also include, for example, the fluctuation due to manufacturing processes, etc. It is sufficient to be substantially perpendicular and substantially parallel.

Hereinabove, embodiments of the invention are described with reference to specific examples. However, the invention is not limited to these specific examples. For example, one skilled in the art may similarly practice the invention by appropriately selecting specific configurations of components such as the mask, the substrate, the optical part, etc., from known art; and such practice is within the scope of the invention to the extent that similar effects can be obtained.

Further, any two or more components of the specific examples may be combined within the extent of technical feasibility and are included in the scope of the invention to the extent that the purport of the invention is included.

Moreover, all pattern formation methods and exposure apparatuses practicable by an appropriate design modification by one skilled in the art based on the pattern formation methods and the exposure apparatuses described above as embodiments of the invention also are within the scope of the invention to the extent that the spirit of the invention is included. Various other variations and modifications can be conceived by those skilled in the art within the spirit of the invention, and it is understood that such variations and modifications are also encompassed within the scope of the invention.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:

1. A pattern formation method, comprising:
disposing a mask and a substrate separately from each other, the mask having a plurality of light transmitting portions arranged periodically; and
irradiating the mask with illumination light emitted from an optical part to irradiate the substrate with at least a part of the illumination light transmitted through the light transmitting portions,
wherein a distance d between the mask and the substrate, a wavelength λ of the illumination light, a pitch p of an arrangement of the light transmitting parts, a numerical aperture NAi of the optical part, and at least one natural number n satisfy the following:

$p \geq 2\lambda$, $(np^2/\lambda) - \alpha \leq d \leq (np^2/\lambda) + \alpha$, $\alpha = p^2/(2\lambda)$, and $\lambda/(8np) \leq NAi \leq \lambda/2np)$.

2. The method according to claim 1, wherein the distance d between the mask and the substrate is different from $np^2/\lambda$.

3. The method according to claim 1, wherein the optical part includes a plurality of lenses arranged in a plane.

4. The method according to claim 1, wherein
the optical part includes an optical member,
a part of incident light incident on the optical member travels in a first direction, and
another part of the incident light travels in a second direction different from the first direction.

5. The method according to claim 1, wherein
the optical part includes a reflecting member,
the reflecting member has a first state and a second state, the reflecting member reflects incident light incident on the reflecting member toward a first direction in the first state, and the reflecting member reflects the incident light toward a second direction different from the first direction in the second state.

6. The method according to claim 1, wherein
the number n is an odd number.

7. The method according to claim 1, wherein
the number n is an even number.

8. The method according to claim 1, wherein
the wavelength of the illumination light is not less than 190 nm and not more than 250 nm.

9. The method according to claim 1, wherein
the illumination light includes an ArF excimer laser.

10. The method according to claim 1, wherein
at least a part of the illumination light transmitted through the light transmitting portions is interference light due to a Talbot effect.

11. An exposure apparatus comprising:
a mask holding part holding a mask, the mask having a plurality of light transmitting portions arranged periodically;
a stage, a substrate being mounted on the stage; and
an optical part emitting illumination light, the mask being irradiated with the illumination light, the substrate being irradiated with at least a part of the illumination light transmitted through the light transmitting portions,
wherein a distance d between the mask and the substrate, a wavelength $\lambda$ of the illumination light, a pitch p of an arrangement of the plurality of light transmitting portions, a numerical aperture NAi of the optical part, and at least one natural number n satisfy the following:

$p \geq 2\lambda$, $(np^2/\lambda) - \alpha \leq d \leq (np^2/\lambda) + \alpha$, $\alpha = p^2/(2\lambda)$, and $\lambda/(8np) \leq NAi \leq \lambda/(2np)$.

12. The apparatus according to claim 11, wherein
the distance d between the mask and the substrate is different from $np^2/\lambda$.

13. The apparatus according to claim 11, wherein
the optical part includes a plurality of lenses arranged in a plane.

14. The apparatus according to claim 11, wherein
the optical part includes an optical member,
a part of incident light incident on the optical member travels in a first direction, and
another part of the incident light travels in a second direction different from the first direction.

15. The apparatus according to claim 11, wherein
the optical part includes a reflecting member,
the reflecting member has a first state and a second state, the reflecting member reflects incident light incident on reflecting member toward a first direction in the first state, and the reflecting member reflects the incident light toward a second direction different from the first direction in the second state.

16. The apparatus according to claim 11, wherein
the number n is an odd number.

17. The apparatus according to claim 11, wherein
the number n is an even number.

18. The apparatus according to claim 11, wherein
the wavelength of the illumination light is not less than 190 nm and not more than 250 nm.

19. The apparatus according to claim 11, wherein
the illumination light includes an ArF excimer laser.

20. The apparatus according to claim 11, wherein
at least a part of the illumination light transmitted through the light transmitting portions is interference light due to a Talbot effect.

* * * * *